(12) United States Patent
Choi et al.

(10) Patent No.: US 10,440,817 B2
(45) Date of Patent: *Oct. 8, 2019

(54) FOLDABLE DISPLAY

(71) Applicant: Samsung Display Co., Ltd., Yongin-si, Gyeonggi-do (KR)

(72) Inventors: Jinhwan Choi, Seoul (KR); Taewoong Kim, Yongin-si (KR); Boik Park, Ulwang-si (KR); Taean Seo, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 219 days.

This patent is subject to a terminal disclaimer.

(21) Appl. No.: 15/468,002

(22) Filed: Mar. 23, 2017

(65) Prior Publication Data

US 2017/0196078 A1 Jul. 6, 2017

Related U.S. Application Data

(63) Continuation of application No. 14/935,194, filed on Nov. 6, 2015, now Pat. No. 9,618,974.

(30) Foreign Application Priority Data

Jan. 19, 2015 (KR) .................. 10-2015-0008752

(51) Int. Cl.
*G06F 1/16* (2006.01)
*H05K 1/02* (2006.01)
*H05K 5/00* (2006.01)

(52) U.S. Cl.
CPC .......... *H05K 1/028* (2013.01); *G06F 1/1641* (2013.01); *G06F 1/1652* (2013.01);
(Continued)

(58) Field of Classification Search
CPC combination set(s) only.
See application file for complete search history.

(56) References Cited

U.S. PATENT DOCUMENTS 9,064,431 B2 6/2015 Ahn et al.
9,164,547 B1 10/2015 Kwon et al.
(Continued)

FOREIGN PATENT DOCUMENTS

KR        10-0932985 B1    12/2009
KR     10-2014-0014669 A    2/2014
KR        10-1389442 B1     4/2014

*Primary Examiner* — Anthony J Frost
(74) *Attorney, Agent, or Firm* — Lewis Roca Rothgerber Christie LLP

(57) ABSTRACT

A foldable display is disclosed. In one aspect, the foldable display includes a display panel including: a plurality of flat regions and a folding region interposed between the flat regions. Each of the flat regions includes a fixed region and a semi-fixed region interposed between the fixed region and the folding region. The foldable display also includes a plurality of substrates respectively attached to the flat regions and a plurality of fixed adhesive members respectively interposed between the fixed regions and the substrates. The fixed adhesive members respectively attach the substrates to the fixed regions. The foldable display further includes a plurality of semi-fixed adhesive members respectively interposed between the semi-fixed regions and the substrates. The semi-fixed adhesive members are configured to respectively attach/detach the semi-fixed adhesive regions to/from the substrates based on the degree to which the display panel is folded.

14 Claims, 6 Drawing Sheets

(52) U.S. Cl.
CPC .......... *H05K 5/0017* (2013.01); *Y10T 428/10* (2015.01); *Y10T 428/1036* (2015.01)

(56) References Cited

U.S. PATENT DOCUMENTS

| | | |
|---|---|---|
| 9,173,287 B1 | 10/2015 | Kim et al. |
| 2006/0038745 A1 | 2/2006 | Naksen et al. |
| 2010/0201604 A1 | 8/2010 | Kee et al. |
| 2012/0147599 A1 | 6/2012 | Shim et al. |
| 2012/0249891 A1* | 10/2012 | Sato .................... G06F 1/1601 348/794 |
| 2013/0010405 A1 | 1/2013 | Rothkopf et al. |

* cited by examiner

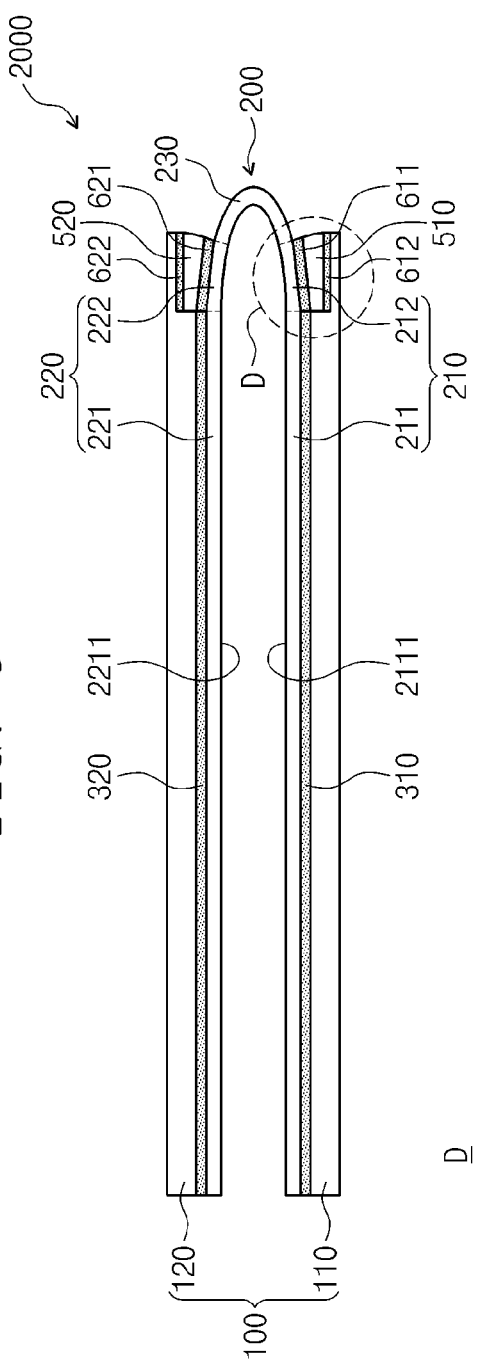
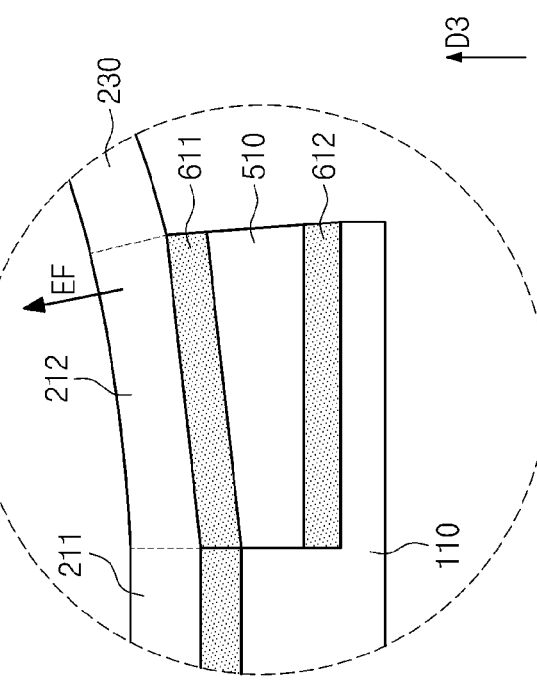

FOLDABLE DISPLAY

CROSS-REFERENCE TO RELATED APPLICATIONS

This U.S. non-provisional patent application is a continuation of U.S. patent application Ser. No. 14/935,194, filed Nov. 6, 2015, which claims priority under 35 U.S.C. § 119 of Korean Patent Application No. 10-2015-0008752, filed on Jan. 19, 2015, the entire contents of which are hereby incorporated by reference.

BACKGROUND

Field

The present disclosure generally relates to a display device, and more particularly, to a foldable or flexible display device.

Description of the Related Technology

Electronic devices that display images, such as smart phones, digital cameras, notebook computers, navigation units, and televisions, include display panels for displaying images.

Thin and lightweight flat display panels are widely used for image display. Many types of flat display panels exist, including liquid crystal display (LCD) panels, organic light-emitting diode (OLED) display panels, plasma display panels (PDPs), electrophoretic display (EPD) panels, and the like.

Additionally, foldable displays, which can be folded for portability and unfolded to increase the viewing area, are being developed.

SUMMARY OF CERTAIN INVENTIVE ASPECTS

One inventive aspect is a foldable display having an improved reliability and durability.

Another aspect is a foldable display including: a display panel including a plurality of non-folding regions and a folding region interposed between the non-folding regions, the non-folding regions each including a fixed region and a semi-fixed region defined between the fixed region and the folding region; a plurality of substrates correspondingly provided to the non-folding regions, respectively; a fixed adhesive member interposed between the fixed region and the substrates, and attaching the substrates to the fixed region; and a semi-fixed adhesive member interposed between the semi-fixed region and the substrates, and attaches/detaches the semi-fixed region to/from the substrates according to a folded degree of the display panel.

In some embodiments, when the display panel is not folded, the semi-fixed adhesive member can attach the semi-fixed region to the substrates, and when the display panel is folded, at least a portion of the semi-fixed region can be detached from the substrates.

In other embodiments, when the display panel is folded, the semi-fixed adhesive member can maintain a configuration of being attached to the substrate and can be detached from the semi-fixed region.

In still other embodiments, when the display panel is folded, the semi-fixed adhesive member can maintain a configuration of being attached to the semi-fixed region and can be detached from the substrate.

In even other embodiments, when the display panel is folded, outer surfaces of the non-folded regions can face each other.

In yet other embodiments, at least a portion of the semi-fixed adhesive member can be detached from the substrates when a folding angle defined by upper surfaces of the substrates is less than an attachment angle.

In further embodiments, when the folding angle is less than the attachment angle, stress applied to the display panel can be greater than a stress limit which generates a crack to the display panel.

In still further embodiments, the fixed adhesive member can have first adhesive force, and the semi-fixed adhesive member can have second adhesive force less than the first adhesive force.

In even further embodiments, the first adhesive force can be about 2,000 to about 5,000 gf/mm, and the second adhesive force can be about 500 to about 1,000 gf/mm.

In yet further embodiments, the fixed adhesive member can comprise an acryl-based adhesive material, and the semi-fixed adhesive member can comprise a silicon-based adhesive material.

Another aspect is a foldable display includes a display panel including a plurality of non-folding regions and a folding region interposed between the non-folding regions, the non-folding regions each including a fixed region and a semi-fixed region defined between the fixed region and the folding region, and having a first flexibility; a plurality of substrates correspondingly provided to the non-folding regions, receptively; a fixed adhesive member interposed between the fixed region and the substrates, and attaches the substrates to the fixed regions; a stress relief part interposed between the semi-fixed region and the plurality of substrates, and having a second flexibility less than the first flexibility; and an auxiliary adhesive members including an upper auxiliary adhesive member interposed between the stress relief part and the semi-fixed region, and attaches the stress relief part to the semi-fixed region and a lower auxiliary adhesive member interposed between the stress relief part and the substrates, and attaches the stress relief part to the substrates.

In some embodiments, the substrates can include a groove recessed toward the lower surface of the substrate to correspond to the semi-fixed region, and the stress relief part can be arranged in the groove.

In other embodiments, a first distance from the lower surface of the substrates opposite the display panel to a lower surface of the fixed region can be substantially equal to a distance from the lower surface of the substrates to a lower surface of the semi-fixed region.

Another aspect is a foldable display comprising a display panel, comprising: a plurality of flat regions, and a folding region interposed between the flat regions, wherein each of the flat regions comprises: a fixed region, and a semi-fixed region interposed between the fixed region and the folding region; a plurality of substrates respectively attached to the flat regions; a plurality of fixed adhesive members respectively interposed between the fixed regions and the substrates, wherein the fixed adhesive members respectively attach the substrates to the fixed regions; and a plurality of semi-fixed adhesive members respectively interposed between the semi-fixed regions and the substrates, wherein the semi-fixed adhesive members are configured to respectively attach/detach the semi-fixed adhesive regions to/from the substrates based on the degree to which the display panel is folded.

In exemplary embodiments, when the display panel is in an unfolded configuration, the semi-fixed regions are respectively attached to the substrates by means of the semi-fixed adhesive members, and when the display panel is in a folded configuration, at least a portion of each of the semi-fixed regions is respectively detached from the corresponding substrate.

In exemplary embodiments, when the display panel is in the folded configuration, each of the semi-fixed adhesive members is attached to the corresponding substrate and is detached from the corresponding semi-fixed region.

In exemplary embodiments, when the display panel is in the folded configuration, each of the semi-fixed adhesive members is attached to the corresponding semi-fixed region and is detached from the corresponding substrate.

In exemplary embodiments, when the display panel is in the folded configuration, outer surfaces of the flat regions face each other.

In exemplary embodiments, at least a portion of each of the semi-fixed adhesive members is detached from the corresponding substrate when a folding angle defined by the substrates is less than an attachment angle.

In exemplary embodiments, when the folding angle is less than the attachment angle, a stress applied to the display panel is greater than a stress limit at which a crack is formed in the display panel.

In exemplary embodiments, each of the fixed adhesive member has a first adhesive force, and wherein each of the semi-fixed adhesive members has a second adhesive force that is less than the first adhesive force.

In exemplary embodiments, the first adhesive force is between about 2,000 to about 5,000 gf/mm, and wherein the second adhesive force is between about 500 to about 1,000 gf/mm.

In exemplary embodiments, each of the fixed adhesive members is formed of an acryl-based adhesive material, and wherein each of the semi-fixed adhesive members is formed of a silicon-based adhesive material.

Another aspect is a foldable display, comprising a display panel, comprising: a plurality of flat regions, and a folding region interposed between the flat regions, wherein the display panel has a first flexibility, and wherein each of the flat regions comprises: a fixed region, and a semi-fixed region interposed between the fixed region and the folding region; a plurality of substrates respectively attached to the flat regions; a plurality of fixed adhesive members respectively interposed between the fixed regions and the substrates, wherein the fixed adhesive members respectively attach the substrates to the fixed regions; a plurality of stress relief portions respectively interposed between the semi-fixed regions and the substrates, wherein each of the stress relief regions has a second flexibility that is less than the first flexibility; and a plurality of auxiliary adhesive members, each comprising: an upper auxiliary adhesive member interposed between the corresponding stress relief portions and the corresponding semi-fixed region, wherein the upper auxiliary adhesive member attach the corresponding stress relief portion to the corresponding semi-fixed region; and a lower auxiliary adhesive member interpose between the corresponding stress relief portions and the corresponding substrate, wherein the lower auxiliary adhesive member attaches the corresponding stress relief portion to the corresponding substrate.

In exemplary embodiments, each of the substrates comprises a groove recessed toward a lower surface of the substrate to correspond to the corresponding semi-fixed region, and wherein the stress relief portion is arranged in the groove.

In exemplary embodiments, a first distance from the lower surface of each of the substrate opposite the display panel to a lower surface of the corresponding fixed region is substantially equal to a distance from a lower surface of each of the substrates to a lower surface of the corresponding semi-fixed region.

BRIEF DESCRIPTION OF THE DRAWINGS

The accompanying drawings are included to provide a further understanding of the described technology, and are incorporated in and constitute a part of this specification. The drawings illustrate exemplary embodiments of the described technology and, together with the description, serve to explain principles of the described technology.

FIG. 9 is a cross-sectional view illustrating a folded configuration of the foldable display shown in FIG. 8.

FIG. 10 is an enlarged cross-sectional view of region D of FIG. 9.

DETAILED DESCRIPTION OF CERTAIN INVENTIVE EMBODIMENTS

Figure 1:
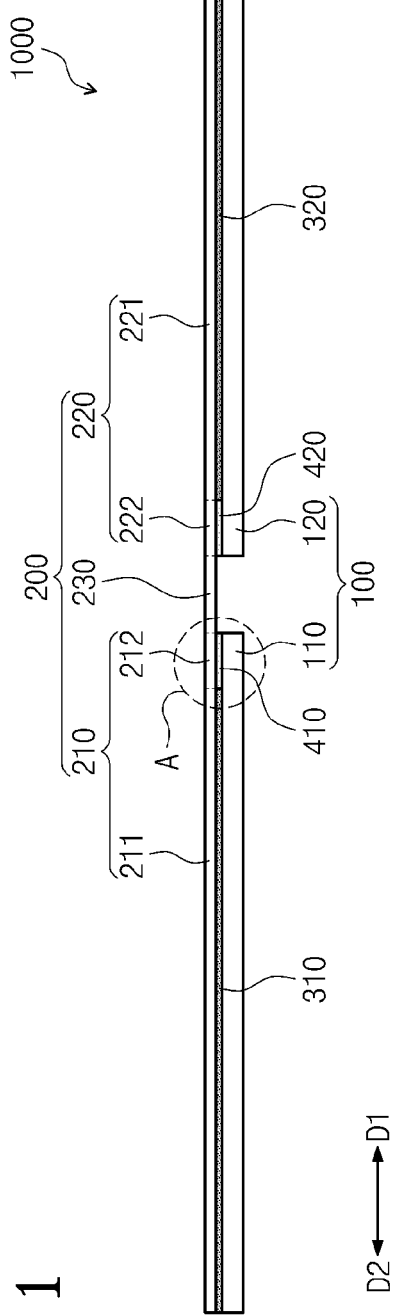
FIG. 1 is a cross-sectional view of a foldable display according to an embodiment.

The described technology can be modified in several different forms, and specific embodiments will be exemplified in the drawings and described in detail. It is to be understood that the described technology is not limited to the disclosed embodiments, and is intended to cover various modifications and equivalent arrangements included within the spirit and scope of the disclosure, including the appended claims.

Like reference numerals refer to like elements throughout. In the drawings, the dimensions and sizes of each structure may be exaggerated, omitted, or schematically illustrated for the sake of clarity. It will be understood that although the terms "first" and "second" may be used herein to describe various elements, these elements should not be limited by these terms. Terms are only used to distinguish one component from other components. For example, an element referred to as a first element in one embodiment can be referred to as a second element in another embodiment. Terms in the singular form may include the plural form unless otherwise intended.

In the specification, the meanings of the terms 'include' and/or 'comprise' specifies the inclusion of the referenced property, numeral, step, operation, element or a combination thereof, but does not exclude other properties, numerals, steps, operations, elements or combinations thereof. In addition, it will be understood that when a layer, a film, a region, or a plate is referred to as being 'on' another layer, film, region, or plate, it can be directly on the other layer, film, region, or plate, or intervening layers, films, regions, or plates may also be present. On the contrary, it will be understood that when a layer, a film, a region, or a plate is referred to as being 'under' another layer, film, region, or plate, it can be directly under the other layer, film, region, or plate, or intervening layers, films, regions, or plates may also be present. Hereinafter, exemplary embodiments will be described in detail with reference to the accompanying drawings.

Figure 2:
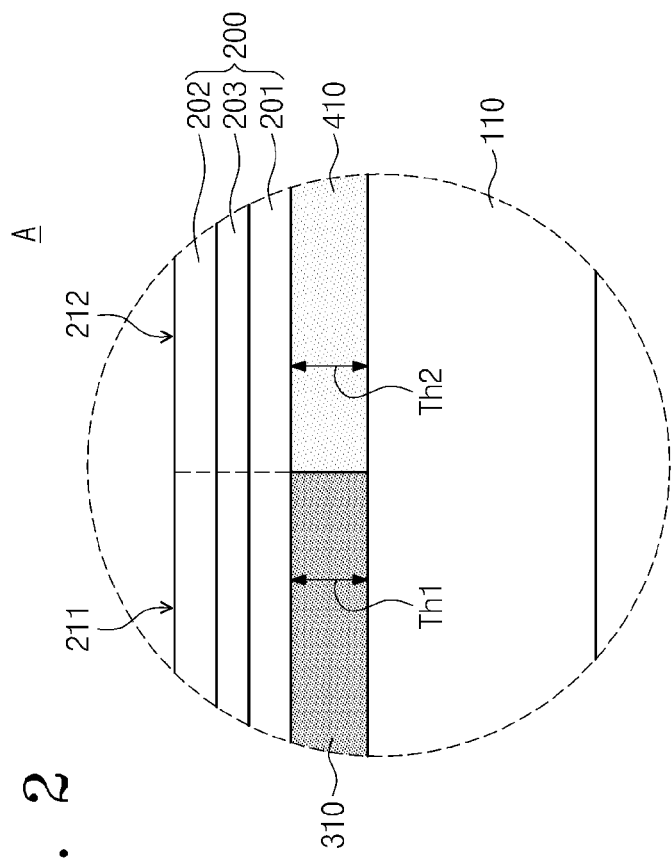
FIG. 2 is an enlarged cross-sectional view of region A of FIG. 1.

FIG. 1 is a cross-sectional view of a display apparatus or foldable display according to an embodiment. FIG. 2 is an enlarged cross-sectional view of region A of FIG. 1.

Referring to FIGS. 1 and 2, the display apparatus 1000 includes a substrate 100 and a display panel 200 formed on the substrate 100.

The display panel 200 can display image(s). The display panel 200 can include an organic light-emitting diode (OLED) display panel, a liquid crystal display (LCD) panel, a plasma display panel (PDP), an electrophoretic display (EPD) panel, or the like.

The display panel 200 includes a lower plate 201 and an upper plate 202 facing the lower plate 201. A light control layer 203 is interposed between the upper plate 202 and the lower plate 201. The lower plate 201 and the upper plate 202 have one or more electrodes. The display panel 200 adjusts an electric field applied to the light control layer 203 through the electrodes to display an image.

The entire or at least a portion of the display panel 200 is flexible. In the current embodiment, the components constituting the display panel 200 are formed of flexible materials. For example, the lower plate 201 and the upper plate 202 can be formed of a material such as plastic. When an external force is applied to the display panel 200, the display panel 200 can be folded due to the external force.

Here, the meaning of the term "folding" is to be transformable from an original shape into another shape, and includes being wound like a roll as well as being bent along one or more lines.

The display panel 200 can include a plurality of non-folding regions or flat regions and a folding region 230.

In an embodiment, the non-folding regions include a first non-folding region or first flat region 210 and a second non-folding region or second flat region 220. The folding region 230 is interposed between the first and second non-folding regions 210 and 220. That is, the first non-folding region 210, the folding region 230, and the second non-folding region 220 can be sequentially defined along a first direction D1.

The substrate 100, for example, includes first and second substrates 110 and 120 which are formed of a rigid material such as glass. The first substrate 110 is arranged in an area corresponding to the first non-folding region 210. The first substrate 110 supports the first non-folding region 210 so that the first non-folding region 210 cannot be folded by external force.

The second substrate 120 is arranged in an area to correspond to the second non-folding region 220. The second substrate 120 can be arranged apart from the first substrate 110 in the first direction D1 by about the width of the folding region 230 along the direction D1. The second substrate 120 supports the second non-folding region 220 so that the second non-folding region 220 cannot be folded by external force.

The first non-folding region 210 includes a first fixed region 211 and a first semi-fixed region 212. The first semi-fixed region 212 is a region adjacent to the folding region 230. More specifically, the first semi-fixed region 212 can be defined between the folding region 230 and the first fixed region 211. That is, the first fixed region 211, the first semi-fixed region 212, and the folding region 230 can be sequentially defined along a first direction D1.

The second non-folding region 220 includes a second fixed region 221 and a second semi-fixed region 222. The second semi-fixed region 222 is a region adjacent to the folding region 230. More specifically, the second semi-fixed region 222 can be defined between the folding region 230 and the second fixed region 221. That is, the second fixed region 221, the second semi-fixed region 222, and the folding region 230 can be sequentially defined along a second direction D2 opposite the first direction D1.

The display apparatus 1000 further includes a fixed adhesive member and a semi-fixed adhesive member, which are interposed between the display panel 200 and the substrate 100. The fixed adhesive member includes first and second fixed adhesive members 310 and 320, and the semi-fixed adhesive member includes first and second semi-fixed adhesive members 410 and 420.

The first and second fixed adhesive members 310 and 320 have adhesiveness. More specifically, the first and second fixed adhesive members 310 and 320 have a first adhesive force. The first adhesive force can be, for example, about 2,000 to about 5,000 gf/mm. Also, in an embodiment, the first and the second fixed adhesive members 310 and 320 may include an acryl-based adhesive material.

The first fixed adhesive member 310 is interposed between the first fixed region 211 and the first substrate 110. The first fixed adhesive member 310 attaches a lower surface of the first fixed region 211 to an upper surface of the first substrate 110. Accordingly, the first fixed region 211 is fixed to the first substrate 110 and is not detached from the first substrate 110, even when the display apparatus 1000 is folded.

The second fixed adhesive member 320 is interposed between the second fixed region 221 and the second substrate 120. The second fixed adhesive member 320 attaches a lower surface of the second fixed region 221 to an upper surface of the second substrate 120. Accordingly, the second fixed region 221 is fixed to the second substrate 120, and is not detached from the second substrate 120, even when the display apparatus 1000 is folded.

The first and second semi-fixed adhesive members 410 and 420 have adhesiveness. More specifically, the first and second semi-fixed adhesive members 410 and 420 have a second adhesive force.

The second adhesive force is less than the first adhesive force. The second adhesive force may be determined such that when the display apparatus 1000 is folded, a stress greater than a stress limit of the display panel 200 is not applied to the first and second semi-fixed regions 212 and 212. This will be described below with reference to FIGS. 4 and 5.

In an embodiment, the second adhesive force can be between about 500 to about 1,000 gf/mm. Also, for example, the first and the second semi-fixed adhesive members 410 and 420 can include a silicon-based adhesive material.

The first semi-fixed adhesive member 410 is interposed between the first semi-fixed region 212 and the first substrate 110. The first semi-fixed adhesive member 410 attaches a lower surface of the first semi-fixed region 212 to an upper surface of the first substrate 110.

Here, the term "semi-fixed" refers to the ability to transition between being fixed or not fixed on the basis of an external force. In other words, when the display apparatus 1000 is not folded and remains unfolded, no external force is applied to the first semi-fixed region 212. Thus, when external force is not applied to the first semi-fixed region 212, the first semi-fixed region 212 is attached and fixed to the first substrate 110 by means of the first semi-fixed adhesive member 410.

On the other hand, when the display apparatus 1000 is folded, external force, which acts in a direction which separates the first semi-fixed region 212 and the first substrate 110, is applied to the first semi-fixed region 212. When external force is applied to the first semi-fixed region 212, the first semi-fixed region 212 can be detached from the first substrate 110. Also, when the external force is not applied again, at least a portion of the first semi-fixed region 212 can be attached and fixed to the first substrate 110 again by means of the first semi-fixed adhesive member 410.

The second semi-fixed adhesive member 420 is interposed between the second semi-fixed region 222 and the second substrate 120. The second semi-fixed adhesive member 420 allows a lower surface of the second semi-fixed region 222 to be semi-fixed to an upper surface of the second substrate 120.

A first thickness Th1 of the first and second fixed adhesive members 310 and 320 can be substantially the same as a second thickness Th2 of the first and second semi-fixed adhesive members 410 and 420.

Accordingly, the generation of a bent portion or a concavo-convex portion in the display panel 200 along a border of the first fixed adhesive member 310 and the first semi-fixed adhesive member 410 can be prevented.

Figure 3:
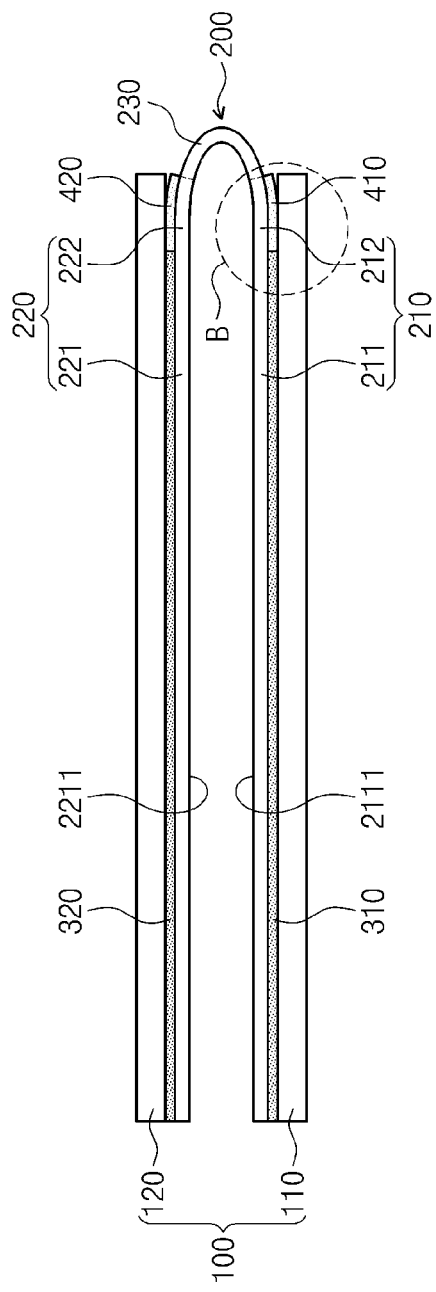
FIG. 3 is a cross-sectional view illustrating a folded configuration of the foldable display shown in FIG. 1.
Figure 4:
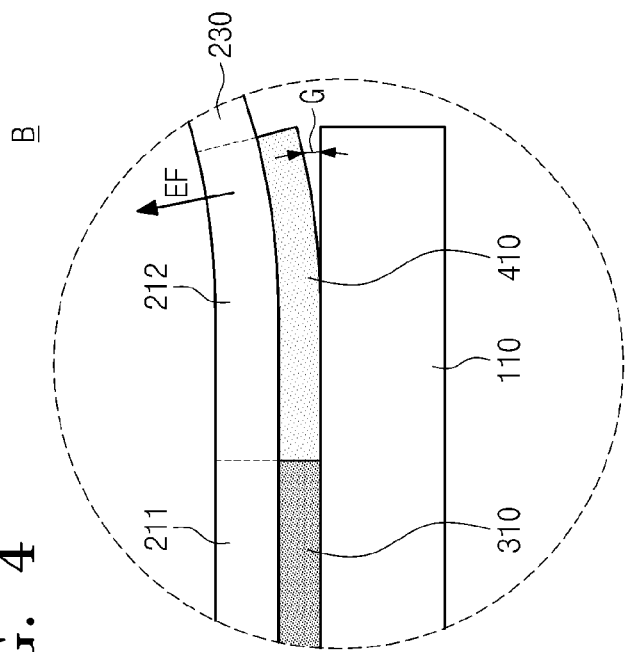
FIG. 4 is an enlarged cross-sectional view of region B of FIG. 3.

FIG. 3 is a cross-sectional view illustrating a folded configuration of the display apparatus shown in FIG. 1. FIG. 4 is an enlarged cross-sectional view of region B of FIG. 3.

Referring to FIGS. 3 and 4, the display apparatus 1000 can be folded such that a first outer surface 2111 of the first fixed region 211 and a second outer surface 2211 of the second fixed region 221 face each other. In this configuration, since the first and second non-folded region 210 and 220 are respectively fixed to the first and second substrate 110 and 120 which are rigid, they are not folded. On the other hand, the folding region 230 is folded because it is not fixed to the first or second substrate 110 or 120.

In general, when an object is folded, stresses are concentrated at a middle region between the folded region and non-folded region of the object. As a result, the middle region may be the most damaged due to folding. That is, when the display apparatus 1000 according to an embodiment is folded, stresses may be concentrated at the first and second semi-fixed regions 212 and 222.

However, the display apparatus 1000 according to an embodiment can relieve the stresses concentrated at the first and second semi-fixed regions 212 and 222.

More specifically, since the first and second semi-fixed regions 212 and 222 are semi-fixed to the first and second substrate 110 and 120 by means of the first and second semi-fixed adhesive members 410 and 420, damage to the first and second semi-fixed regions 212 and 222 can be prevented when the display apparatus 1000 is folded.

More specifically, the first and second semi-fixed adhesive members 410 and 420 attach/detach the first and second semi-fixed regions 212 and 222 to/from the first and second substrates 110 and 120 according to the folded degree of the display panel 200.

As illustrated in FIGS. 3 and 4, when the display apparatus 1000 is folded, external force EF is generated in the first and second semi-fixed regions 212 and 222, and the external force EF acts as a stress on the first and second semi-fixed regions 212 and 222. By means of the external force EF, at least a portion of the semi-fixed adhesive members 410 and 420 is respectively detached from upper surfaces of the first and second substrates 110 and 120, and a gap G is defined between the first and second semi-fixed adhesive members 410 and 420 and the first and second substrates 110 and 120. As a result, stresses generated in the first and second semi-fixed regions 212 and 222 can be reduced.

The adhesive force between the first and second semi-fixed members 410 and 420 and the first and second substrates 110 and 120 can be weaker than the adhesive force between the first and second semi-fixed adhesive members 410 and 420 and the first and second semi-fixed regions 212 and 222. Accordingly, the first and second semi-fixed adhesive members 410 and 420 can maintain the configurations of being attached to the first and second semi-fixed regions 212 and 222.

Also, embodiments are not limited thereto, and the adhesive force between the first and second semi-fixed members 410 and 420 and the first and second substrates 110 and 120 can be stronger than the adhesive force between the first and second semi-fixed adhesive members 410 and 420 and the first and second semi-fixed regions 212 and 222. In these embodiments, when the display apparatus 1000 is folded, the first and second semi-fixed adhesive members 410 and 420 are detached from the first and second semi-fixed regions 212 and 222, and the first and second semi-fixed adhesive members 410 and 420 can maintain a configuration in which the first and second semi-fixed adhesive members 410 and 420 are attached to the first and second substrates 110 and 120.

Figure 5:
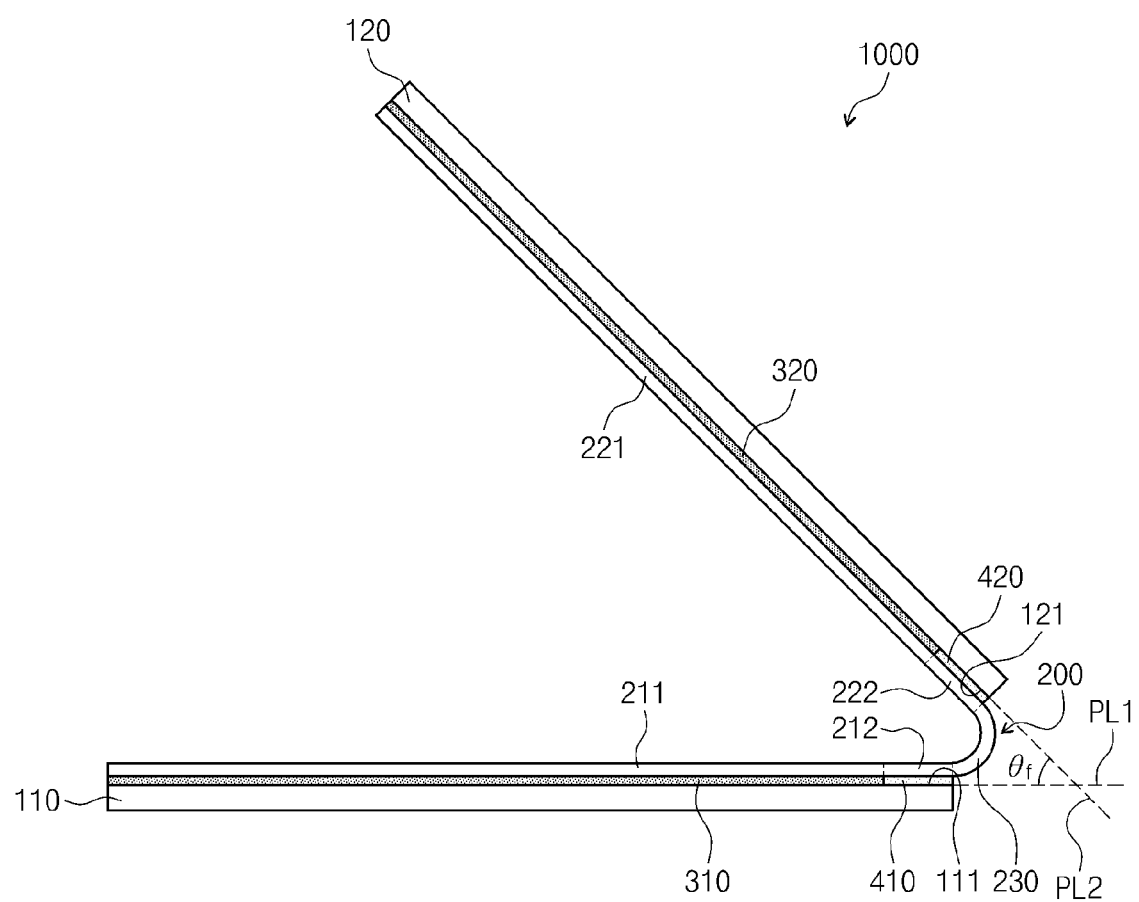
FIG. 5 is a cross-sectional view illustrating a folding angle of the foldable display shown in FIG. 1.

FIG. 5 is a cross-sectional view illustrating a folding angle of the display apparatus shown in FIG. 1.

Referring to FIG. 5, when the display apparatus 1000 is folded, a folding angle $\theta_f$ of the display apparatus 1000 can be defined. The folding angle $\theta_f$ can be defined as an angle between a first extending line PL1 parallel to a first upper surface 111 of the first substrate 110 and a second extending line PL2 parallel to a second upper surface 121 of the second substrate 120.

In an embodiment, when the folding angle $\theta_f$ is less than a predetermined attachment angle, the first and second semi-fixed adhesive members 410 and 420 are respectively detached from the first and second substrates 110 and 120. In other words, when the folding angle $\theta_f$ is greater than the attachment angle, the first and second semi-fixed adhesive members 410 and 420 can maintain the configuration in which the first and second semi-fixed adhesive members 410 and 420 are attached to the first and second substrates 110 and 120. This is because the external force (EF of FIG. 4) acting on the first and second semi-fixed adhesive members 410 and 420 is greater than an adhesive force between the first and second semi-fixed adhesive members 410 and 420 and the first and second substrates 110 and 120, when the folding angle $\theta_f$ becomes less than the attachment angle.

Also, based on the folding angle $\theta_f$, the magnitudes of stresses in the first and second semi-fixed regions 212 and 222 can be determined. For example, as the folding angle $\theta_f$ decreases, the magnitudes of stresses generated in the first and second semi-fixed regions 212 and 222 increase.

When the folding angle $\theta_f$ is greater than the attachment angle, the stresses generated in the display panel 200 are less than the stress limit of the display panel 200. Also, when the folding angle $\theta_f$ is less than the attachment angle, the stresses generated in the display panel 200 are greater than the stress limit of the display panel 200.

Here, the stress limit is the maximum stress which does not generate a crack in the display panel 200, and when a stress greater than the stress limit is applied to the display panel 200, a crack may be generated in the display panel 200. Thus, when the display apparatus 1000 is folded by an angle less than the attachment angle, stress which may occur in the display panel 200 can be relieved by separating the first and second semi-fixed adhesive members 410 and 420 from the first and second substrates 110 and 120. As a result, even when the display apparatus 1000 is folded, the generation of crack(s) in the display panel 200 can be prevented, and the durability and reliability of the display apparatus 1000 can be improved.

Figure 6:
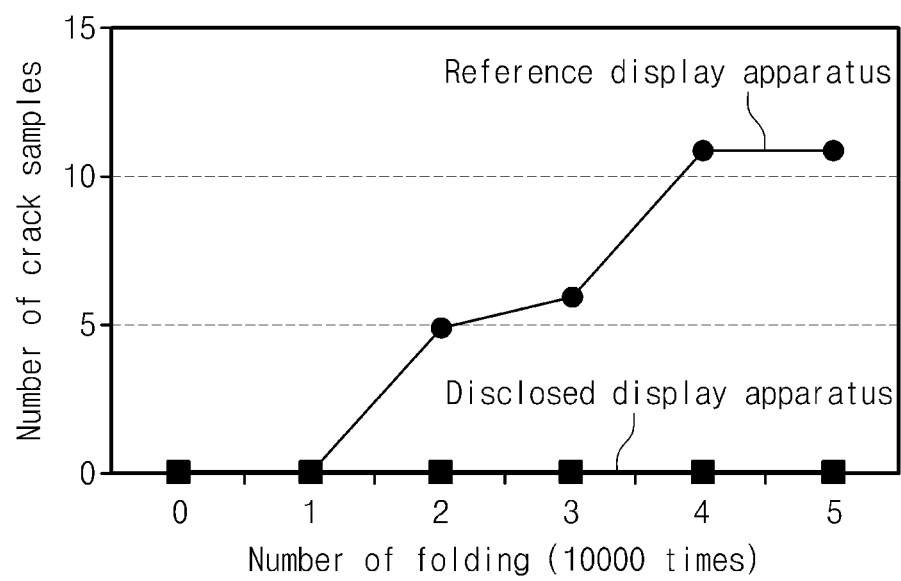
FIG. 6 is a graph illustrating the number of crack samples according to the number of times the foldable display has been folded.

FIG. 6 is a graph illustrating an experiment to sample the number of cracks according to the number of times the display apparatus has been folded. A crack sample means a sample having a crack that has resulted from folding.

In FIG. 6, the x-axis denotes the number of times the display apparatus has been folded and the y-axis denotes the number of generated crack samples. In FIG. 6, a reference display apparatus and the display apparatus 1000 (shown in FIG. 1) according to at least one embodiment are folded, and the number of crack samples according to the number of times the respective apparatuses are folded is illustrated.

The reference display apparatus does not include the first and second semi-fixed adhesive members 410 and 420.

As illustrated in FIG. 6, in the reference display apparatus, a crack sample occurs from 10,000 folding events or greater and the number of crack occurrences increases in proportion to the number of folding events. On the other hand, even after the display apparatus 1,000 is folded 50,000 times, it can be seen that no crack samples have occurred.

Figure 7:
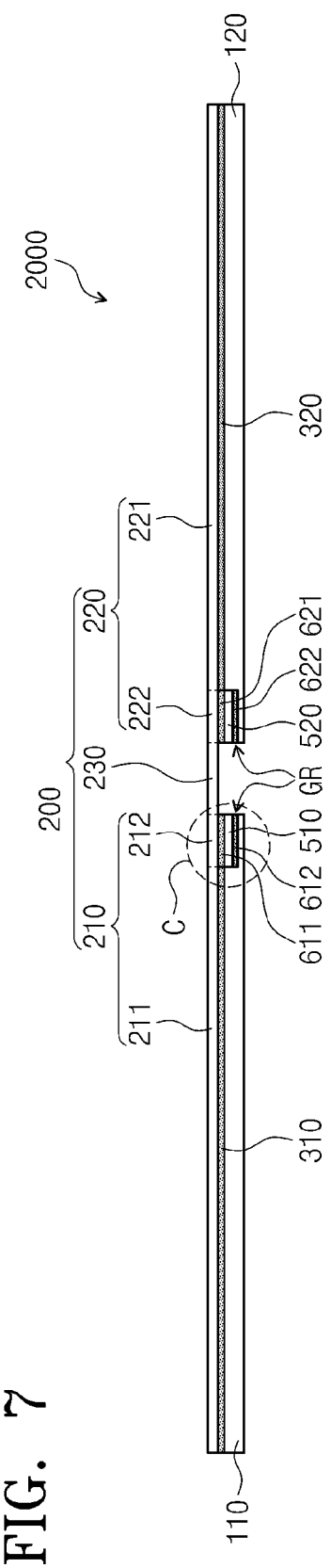
FIG. 7 is a cross-sectional view of a foldable display according to another embodiment.
Figure 8:
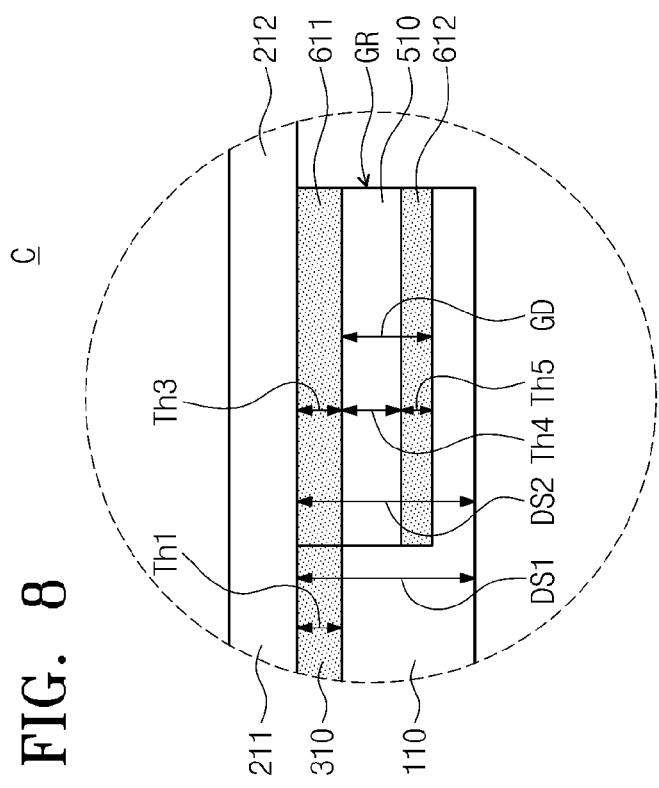
FIG. 8 is an enlarged cross-sectional view of region C of FIG. 7.

FIG. 7 is a cross-sectional view of a display apparatus according to another embodiment. FIG. 8 is an enlarged cross-sectional view of a region C of FIG. 7.

Referring to FIGS. 7 and 8, the display apparatus 2000 is the same as the display apparatus 1000 except that a stress relief part or stress relief portion and auxiliary adhesive members are included instead of the first and second semi-fixed adhesive members 410 and 420 illustrated in FIG. 1. Hereinafter, the same components as those described above are denoted by the same reference numerals, and descriptions thereof will not be provided.

The stress relief part includes first and second stress relief parts or first and second stress relief portions 510 and 520. The first stress relief part 510 is interposed between the first semi-fixed region 212 and the first substrate 110. Also, the second stress relief part 520 is interposed between the second semi-fixed region 222 and the second substrate 120.

The first and second stress relief parts 510 and 520 have a second flexibility. The second flexibility can be less than first flexibility of the display panel 200. Accordingly, when the same magnitude of external force is applied to the first and second stress relief parts 510 and 520 and the display panel 200, the first and second stress relief parts 510 and 520 can be deformed due to the external force to a greater extent than the deformation of the display panel 200 due to the external force.

The auxiliary adhesive members include a first upper auxiliary adhesive member 611, a first lower auxiliary adhesive member 612, a second upper auxiliary adhesive member 621, and a second lower auxiliary adhesive member 622.

The auxiliary adhesive member has adhesiveness. More specifically, the auxiliary adhesive members have a third adhesive force. The third adhesive force can be, for example, between about 2,000 through about 5,000 gf/mm. Also, in an embodiment, the auxiliary adhesive members can include acryl-based adhesive materials.

The first upper auxiliary adhesive member 611 is interposed between the first stress relief part 510 and the first semi-fixed region 212, and attaches the first stress relief part 510 to the first semi-fixed region 212. Accordingly, the first stress relief part 510 is not detached from the first semi-fixed region 212 but fixed thereto even when the display apparatus 2000 is folded. Also, the first lower auxiliary adhesive member 612 is interposed between the first stress relief part 510 and the first substrate 110, and attaches the first stress relief part 510 to the first substrate 110. Accordingly, the first stress relief part 510 is not detached from the first substrate 110 but fixed thereto even when the display apparatus 2000 is folded.

The second upper auxiliary adhesive member 621 is interposed between the second stress relief part 520 and the second semi-fixed region 222, and attaches the second stress relief part 520 to the second semi-fixed region 222. Accordingly, the second stress relief part 520 is not detached from the second semi-fixed region 222 but fixed thereto even when the display apparatus 2000 is folded. Also, the second lower auxiliary adhesive member 622 is interposed between the second stress relief part 520 and the second substrate 120, and attaches the second stress relief part 520 to the second substrate 120. Accordingly, the second stress relief part 520 is not detached from the second substrate 120 but fixed thereto even when the display apparatus 2000 is folded.

The first and second substrates 110 and 120 respectively include grooves GR recessed toward lower surfaces of the first and second substrates 110 and 120 to correspond to the first and second semi-fixed regions 212 and 222.

As illustrated in FIG. 8, the first stress relief part 510 is arranged in the groove GR. Accordingly, the first lower auxiliary adhesive member 612 attaches a lower surface of the first stress relief part 510 to a lower surface of the groove GR.

A first distance DS1 from the lower surface of the first substrate 110 to the lower surface of the first fixing region 211 is the same as a second distance DS2 from the lower surface of the first substrate 110 to the lower surface of the first semi-fixed region 212.

More specifically, the first thickness Th1 may be substantially the same as a third thickness Th3 of the first upper auxiliary adhesive member 611. Also, the depth GD of the groove can be substantially the same as the sum of a fourth thickness Th4 of the first stress relief part 510 and a fifth thickness Th5 of the first lower auxiliary adhesive member 612.

Accordingly, the generation of a bent portion or a concavo-convex portion, along a border of the first fixed adhesive member 310 and the first upper auxiliary adhesive member 611, can be prevented.

FIG. 9 is a cross-sectional view illustrating a folded configuration of the display apparatus shown in FIG. 8. FIG. 10 is an enlarged cross-sectional view of a region D of FIG. 9.

Referring to FIGS. 9 and 10, the display apparatus 2000 can be folded such that a first outer surface 2111 of the first fixed region 211 and a second outer surface 2211 of the second fixed region 221 face each other. In this configuration, since the first and second non-folded regions 210 and 220 are respectively fixed to the first and second substrates 110 and 120 which are rigid, they are not folded. On the other hand, the folding region 230 is folded because it is not fixed to the first or second substrates 110 or 120. The display apparatus 2000 according to an embodiment, can relieve stresses concentrated at the first and second semi-fixed regions 212 and 222 when the display apparatus 2000 is folded.

More specifically, since the second flexibility of the first and second stress relief parts 510 and 520 is less than the first flexibility of the display panel 2000, the damage to the first and second semi-fixed region 212 and 222 can be prevented when the display apparatus 2000 is folded.

More specifically, as illustrated in FIGS. 9 and 10, when the display apparatus 2000 is folded, external force EF is generated in the first and second semi-fixed regions 212 and 222, and the external force EF acts as a stress on the first and second semi-fixed regions 212 and 222. By means of the external force EF, the first and second stress relief parts 510 and 520 extend in a third direction D3 perpendicular to the first and second substrates 110 and 120 to correspond to the external force. As a result, stresses generated in the first and second semi-fixed regions 212 and 222 can be reduced.

As a result, even if the display apparatus 2000 is folded, the generation of crack(s) in the display panel 200 can be prevented, and the durability and reliability of the display apparatus 2000 can be improved.

When a display apparatus according to at least one embodiment is folded, stress that is less than a stress limit of the display panel is applied to a semi-fixed area of the display panel. Accordingly, the generation of crack(s) in the display panel can be prevented, and thus the reliability and durability of the display apparatus can be improved.

While the inventive technology has been described with reference to preferred embodiments thereof, it will be readily understood by those skilled in the art that various modifications and changes can be made thereto without departing from the spirit and scope of the invention defined by the appended claims. Therefore, the scope of the inventive technology is defined not by the detailed description but by the appended claims.

The above-disclosed subject matter is to be considered illustrative and not restrictive, and the appended claims are intended to cover all such modifications, enhancements, and other embodiments, which fall within the true spirit and scope of the inventive technology. Thus, to the maximum extent allowed by law, the scope of the inventive technology is to be determined by the broadest permissible interpretation of the following claims and their equivalents, and shall not be restricted or limited by the foregoing detailed description.

What is claimed is:

1. A foldable display, comprising:
    a display panel, comprising:
        a plurality of flat regions, and
        a folding region interposed between the flat regions, wherein each of the flat regions comprises:
            a fixed region, and
            a semi-fixed region interposed between the fixed region and the folding region;
    a plurality of substrates respectively attached to the flat regions; and
    a plurality of semi-fixed adhesive members respectively interposed between the semi-fixed regions and the substrates, wherein the semi-fixed adhesive members are configured to respectively attach/detach the semi-fixed adhesive regions to/from the substrates based on the degree to which the display panel is folded.

2. The foldable display of claim 1, wherein:
    when the display panel is in an unfolded configuration, the semi-fixed regions are respectively attached to the substrates by means of the semi-fixed adhesive members, and
    when the display panel is in a folded configuration, at least a portion of each of the semi-fixed regions is respectively detached from the corresponding substrate.

3. The foldable display of claim 2, wherein when the display panel is in the folded configuration, each of the semi-fixed adhesive members is attached to the corresponding substrate and is detached from the corresponding semi-fixed region.

4. The foldable display of claim 2, wherein when the display panel is in the folded configuration, each of the semi-fixed adhesive members is attached to the corresponding semi-fixed region and is detached from the corresponding substrate.

5. The foldable display of claim 4, wherein when the display panel is in the folded configuration, outer surfaces of the flat regions face each other.

6. The foldable display of claim 4, wherein at least a portion of each of the semi-fixed adhesive members is detached from the corresponding substrate when a folding angle defined by the substrates is less than an attachment angle.

7. The foldable display of claim 6, wherein when the folding angle is less than the attachment angle, a stress applied to the display panel is greater than a stress limit at which a crack is formed in the display panel.

8. The foldable display of claim 1, wherein each of the semi-fixed adhesive member is formed of a silicon-based adhesive material.

9. A foldable display, comprising:
    a display panel, comprising:
        a plurality of flat regions, and
        a folding region interposed between the flat regions, wherein the display panel has a first flexibility, and wherein each of the flat regions comprises:
            a fixed region, and
            a semi-fixed region interposed between the fixed region and the folding region;
    a plurality of substrates respectively attached to the flat regions; and
    a plurality of stress relief portions respectively interposed between the semi-fixed regions and the substrates, wherein each of the stress relief regions has a second flexibility that is less than the first flexibility.

10. The foldable display of claim 9, wherein each of the substrates comprises a groove recessed toward a lower surface of the substrate to correspond to the corresponding semi-fixed region, and wherein the stress relief portion is arranged in the groove.

11. The foldable display of claim 10, wherein a first distance from the lower surface of each of the substrate opposite the display panel to a lower surface of the corresponding fixed region, is substantially equal to a distance from a lower surface of each of the substrates to a lower surface of the corresponding semi-fixed region.

12. A foldable display, comprising:
    a display panel, comprising:
        a plurality of flat regions, and
        a folding region interposed between the flat regions, wherein the display panel has a first flexibility, and wherein each of the flat regions comprises:
            a fixed region, and a semi-fixed region interposed between the fixed region and the folding region;

a plurality of substrates respectively attached to the flat regions;

a plurality of stress relief portions respectively interposed between the semi-fixed regions and the substrates, wherein each of the stress relief regions has a second flexibility that is less than the first flexibility; and a plurality of auxiliary adhesive members, each comprising:

an upper auxiliary adhesive member interposed between the corresponding stress relief portions and the corresponding semi-fixed region, wherein the upper auxiliary adhesive member attaches the corresponding stress relief portion to the corresponding semi-fixed region; and a lower auxiliary adhesive member interposed between the corresponding stress relief portions and the corresponding substrate, wherein the lower auxiliary adhesive member attaches the corresponding stress relief portion to the corresponding substrate.

13. The foldable display of claim 12, wherein each of the substrates comprises a groove recessed toward a lower surface of the substrate to correspond to the corresponding semi-fixed region, and wherein the stress relief portion is arranged in the groove.

14. The foldable display of claim 13, wherein a first distance from the lower surface of each of the substrate opposite the display panel to a lower surface of the corresponding fixed region is substantially equal to a distance from a lower surface of each of the substrates to a lower surface of the corresponding semi-fixed region.

* * * * *